United States Patent
Ko

(10) Patent No.: US 10,090,439 B2
(45) Date of Patent: Oct. 2, 2018

(54) LIGHT EMITTING DEVICE, LIGHT EMITTING DEVICE PACKAGE, AND LIGHT UNIT

(71) Applicant: LG INNOTEK CO., LTD., Seoul (KR)

(72) Inventor: Eun Bin Ko, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 157 days.

(21) Appl. No.: 15/114,149

(22) PCT Filed: Sep. 2, 2014

(86) PCT No.: PCT/KR2014/008218
§ 371 (c)(1),
(2) Date: Jul. 26, 2016

(87) PCT Pub. No.: WO2015/111814
PCT Pub. Date: Jul. 30, 2015

(65) Prior Publication Data
US 2017/0012171 A1    Jan. 12, 2017

(30) Foreign Application Priority Data
Jan. 27, 2014  (KR) .................. 10-2014-0009605

(51) Int. Cl.
*H01L 33/00* (2010.01)
*H01L 33/30* (2010.01)
(Continued)

(52) U.S. Cl.
CPC ............ *H01L 33/305* (2013.01); *H01L 33/04* (2013.01); *H01L 33/06* (2013.01); *H01L 33/22* (2013.01);
(Continued)

(58) Field of Classification Search
CPC .......... H01L 33/04; H01L 33/06; H01L 33/44; H01L 33/305; H01L 33/025
(Continued)

(56) References Cited

U.S. PATENT DOCUMENTS 7,098,490 B2 * 8/2006 Micovic .............. H01L 29/7787
257/192
8,835,979 B1 * 9/2014 De Lyon ................ H01L 31/11
257/184

(Continued)

FOREIGN PATENT DOCUMENTS

| KR | 10-0658308 | 12/2006 |
| KR | 10-0764433 | 10/2007 |
| KR | 10-0875444 | 12/2008 |
| KR | 10-2013-0078985 | 7/2013 |

OTHER PUBLICATIONS

International Search Report (with English Translation) and Written Opinion dated Dec. 2, 2014 issued in Application No. PCT/KR2014/008218.

*Primary Examiner* — Kevin M Picardat
(74) *Attorney, Agent, or Firm* — KED & Associates, LLP

(57) ABSTRACT

Disclosed are a light emitting device, a first conductive semiconductor layer, a second conductive semiconductor layer, and an active layer comprising a barrier layer which is disposed between the first conductive semiconductor layer and the second conductive semiconductor layer, and which has an un-doped area and a doped area with dopants.

19 Claims, 7 Drawing Sheets

(51) Int. Cl.
*H01L 33/04* (2010.01)
*H01L 33/06* (2010.01)
*H01L 33/44* (2010.01)
*H01L 33/22* (2010.01)
*H01L 33/40* (2010.01)

(52) U.S. Cl.
CPC .......... *H01L 33/44* (2013.01); *H01L 33/0079* (2013.01); *H01L 33/405* (2013.01)

(58) Field of Classification Search
USPC ........................................................ 257/101
See application file for complete search history.

(56) References Cited

U.S. PATENT DOCUMENTS

| | | | |
|---|---|---|---|
| 2005/0067613 A1* | 3/2005 | Kim ................. | B82Y 20/00 257/14 |
| 2005/0201439 A1* | 9/2005 | Horie ............... | B82Y 20/00 372/43.01 |
| 2008/0014671 A1* | 1/2008 | Yamamoto .......... | B82Y 20/00 438/45 |
| 2008/0308787 A1 | 12/2008 | Lee et al. | |
| 2010/0079359 A1* | 4/2010 | Kunoh .............. | B82Y 20/00 345/55 |
| 2010/0123161 A1* | 5/2010 | Takeuchi ........... | H01L 33/387 257/99 |
| 2012/0211801 A1* | 8/2012 | Hashimoto ......... | H01L 29/7785 257/194 |

* cited by examiner

LIGHT EMITTING DEVICE, LIGHT EMITTING DEVICE PACKAGE, AND LIGHT UNIT

CROSS-REFERENCE TO RELATED PATENT APPLICATIONS

This application is a U.S. National Stage Application under 35 U.S.C. §371 of PCT Application No. PCT/KR2014/008218, filed Sep. 2, 2014, which claims priority to Korean Patent Application No. 10-2014-0009605, filed Jan. 27, 2014, whose entire disclosures are hereby incorporated by reference.

TECHNICAL FIELD

Embodiments relate to a light emitting device, a light emitting device package and a light unit.

BACKGROUND ART

Laser Diode (LD) and Light Emitting Diode (LED) are usually used as examples of light emitting device. The light emitting device converts electrical signals into a form of light such as infrared ray, visible ray and ultraviolet ray using characteristics of a compound semiconductor.

As light efficiency of the light emitting device increases, the light emitting device is applied in a variety of fields, including display device and lighting equipment.

INVENTION

Technical Problem

Embodiments provide a light emitting device, a light emitting device package and a light unit, capable of reducing an operating voltage and enhancing luminous intensity.

Technical Solution

In accordance with an embodiment of the present disclosure, there is provided a light emitting device, which comprises a first conductive semiconductor layer; a second conductive semiconductor layer; and an active layer comprising a barrier layer which is disposed between the first conductive semiconductor layer and the second conductive semiconductor layer, and which has an un-doped area and a doped area with dopants.

In accordance with another embodiment of the present disclosure, there is provided a light emitting device, which comprises a first conductive semiconductor layer; an active layer comprising an un-doped first barrier layer disposed under the first conductive semiconductor layer, a second barrier layer which is disposed under the un-doped first barrier layer and has an area whose doping concentration changes depending on the distance from the un-doped first barrier layer, and a un-doped third barrier layer disposed under the second barrier layer; a second conductive semiconductor layer under the active layer; and a window layer which under the second conductive semiconductor layer.

In accordance with yet another embodiment of the present disclosure, there is provided a light emitting device package, which comprises a body; a first and a second lead electrode disposed in the body; and a light emitting device in the body and electrically connected to the first and second lead electrodes, wherein the light emitting device comprises a first conductive semiconductor layer; a second conductive semiconductor layer; and an active layer comprising a barrier layer which is disposed between the first conductive semiconductor layer and the second conductive semiconductor layer, and which has an un-doped area and a doped area with dopants.

In accordance with still yet another embodiment of the present disclosure, there is provided a light emitting device package, which comprises a body; a first and a second lead electrode disposed in the body; and a light emitting device disposed in the body and to be electrically connected to the first and second lead electrodes, wherein the light emitting device comprises a first conductive semiconductor layer; an active layer comprising an un-doped first barrier layer disposed under the first conductive semiconductor layer, a second barrier layer which is disposed under the un-doped first barrier layer and has an area whose doping concentration changes depending on the distance from the un-doped first barrier layer, and a un-doped third barrier layer disposed under the second barrier layer; a second conductive semiconductor layer disposed under the active layer; and a window layer disposed under the second conductive semiconductor layer.

Advantageous Effects

The light emitting device, the light emitting device package and the light unit according to the embodiments have advantages of reducing an operating voltage and enhancing luminous intensity.

BEST MODE

In the description of embodiments, when each layer (film), area, pattern or structures are described to be formed "on" or "under" each layer (film), area, pad, or patterns, the term "on" and "under" include all the meanings of "directly" or "indirectly". Further, references to "on" and "under" each layer will be described based on the drawings.

Hereinafter, the light emitting device, the light emitting device package, the light unit and the method for manufacturing the light emitting device according to the embodiments will be described with reference to the accompanying drawings.

Figure 1:
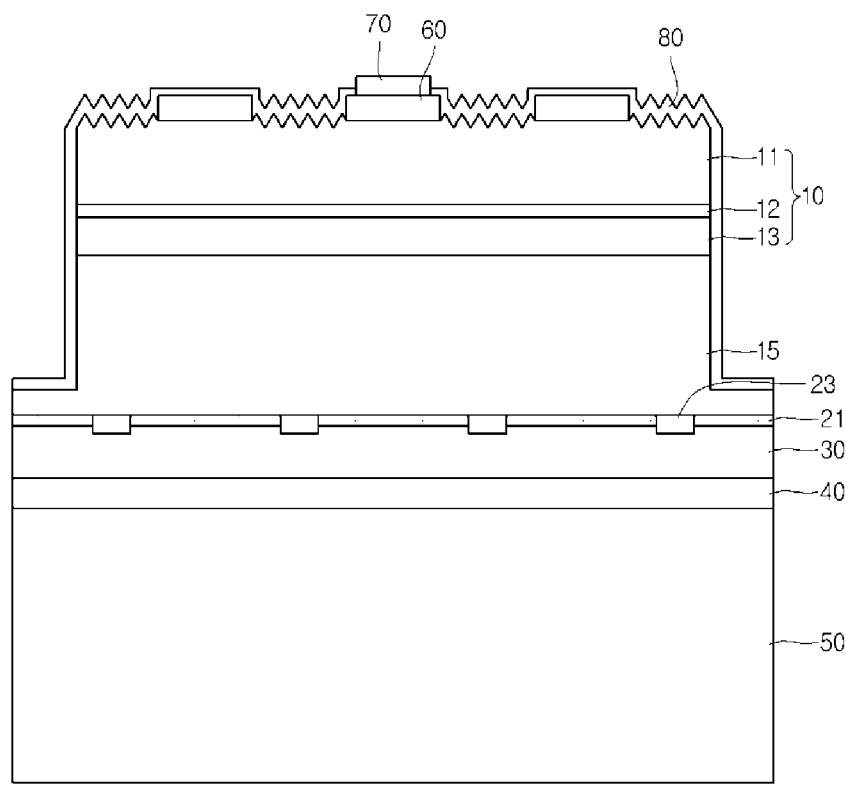
FIG. 1 is a view illustrating a light emitting device according to an embodiment.

FIG. 1 is a view illustrating a light emitting device according to an embodiment.

The light emitting device according to an embodiment may include a light emitting structure 10 as illustrated in FIG. 1. The light emitting structure 10 may include a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be disposed under the first conductive semiconductor layer 11, and the second conductive semiconductor layer 13 may be disposed under the active layer 12.

For example, the first conductive semiconductor layer 11 may be formed of n-type semiconductor layer doped with an n-type dopant as a first conductive dopant, and the second conductive semiconductor layer 13 may be formed of a p-type semiconductor layer doped with a p-type dopant as a second conductive dopant. Further, the first conductive semiconductor layer 11 may be formed of a p-type semiconductor layer, and the second conductive semiconductor layer 13 may be formed of an n-type semiconductor layer.

The first conductive semiconductor layer 11 may include an n-type semiconductor layer, for example. The first conductive semiconductor layer 11 may be embodied with a compound semiconductor. The first conductive semiconductor layer 11 may be embodied with a groups II-VI compound semiconductor or a groups III-V compound semiconductor, for example.

For example, the first conductive semiconductor layer 11 may be embodied with a semiconductor material having a compositional formula of $(Al_xGa_{1-x})_yIn_{1-y}P(0 \leq x \leq 1, 0 \leq y \leq 1)$. In the first conductive semiconductor layer 11, for example, the compositional formula may have y of a value 0.5 and x of values 0.5 to 0.8. The first conductive semiconductor layer 11 may include at least one of AlGaInP, AlInP, GaP, GaInP, etc., and doped with an n-type dopant such as Si, Ge, Sn, Se, Te, etc., for example.

The active layer 12 is a layer in which electrons (or holes) injected through the first conductive semiconductor layer 11 and holes (or electrons) injected through the second conductive semiconductor layer 13 meet each other and which emits light using a band gap difference of energy bands according to materials forming the active layer 12. The active layer 12 may be formed of any one of a single well structure, a multiple well structure, a quantum dot structure and a quantum wire structure, which is not limited thereto.

The active layer 12 may be embodied with a compound semiconductor. The active layer 12 may be embodied with a groups II-VI or groups III-V compound semiconductor, for example. The active layer 12 may be embodied with a semiconductor material having a compositional formula of $(Al_xGa_{1-x})_yIn_{1-y}P(0 \leq x \leq 1, 0 \leq y \leq 1)$, for example. The active layer 12 may include at least one of AlGaInP, AlInP, GaP, GaInP, etc., for example. When the active layer 12 is embodied with a multiple well structure, the active layer 12 may be embodied by stacking a plurality of well layers and a plurality of barrier layers.

The second conductive semiconductor layer 13 may be embodied with a p-type semiconductor layer, for example. The second conductive semiconductor layer 13 may be embodied with a compound semiconductor. The second conductive semiconductor layer 13 may be embodied with a groups II-VI or groups III-V compound semiconductor, for example.

For example, the second conductive semiconductor layer 13 may be embodied with a semiconductor material having a compositional formula of $(Al_xGa_{1-x})_yIn_{1-y}P(0 \leq x \leq 1, 0 \leq y \leq 1)$. The second conductive semiconductor layer 13 may be selected from AlGaInP, AlInP, GaP, GaInP, etc., and doped with a p-type dopant such as Mg, Zn, Ca, Sr, Ba, C, etc., for example.

For example, the light emitting structure 10 may be embodied by including two or more devices selected from Aluminum Al, Gallium Ga, Indium In and Phosphorus P.

Meanwhile, the first conductive semiconductor layer 11 may include a p-type semiconductor layer, and the second conductive semiconductor layer 13 may include an n-type semiconductor layer. Also, a semiconductor layer including an n-type or p-type semiconductor layer may further be formed under the second conductive semiconductor layer 13. Accordingly, the light emitting structure 10 may have at least one of np, pn, npn, and pnp junction structures. Also, doping concentrations of the first and second conductive semiconductor layers 11 and 13 may be formed uniformly or non-uniformly. That is, the light emitting structure 10 may be formed in a variety of structures, which is not limited thereto.

The active layer 12 according to an embodiment may include a plurality of barrier layers and a plurality of well layers. The active layer 12 may include a barrier layer having an un-doped area and an doped area with dopants. The barrier layer of the active layer 12 may be doped with an n-type dopants. For example, the barrier layer and well layer of the active layer 12 may be provided by a composite of AlGaInP, and the content of Al contained in the barrier layer is greater than the content of Al contained in the well layer.

Figure 2:
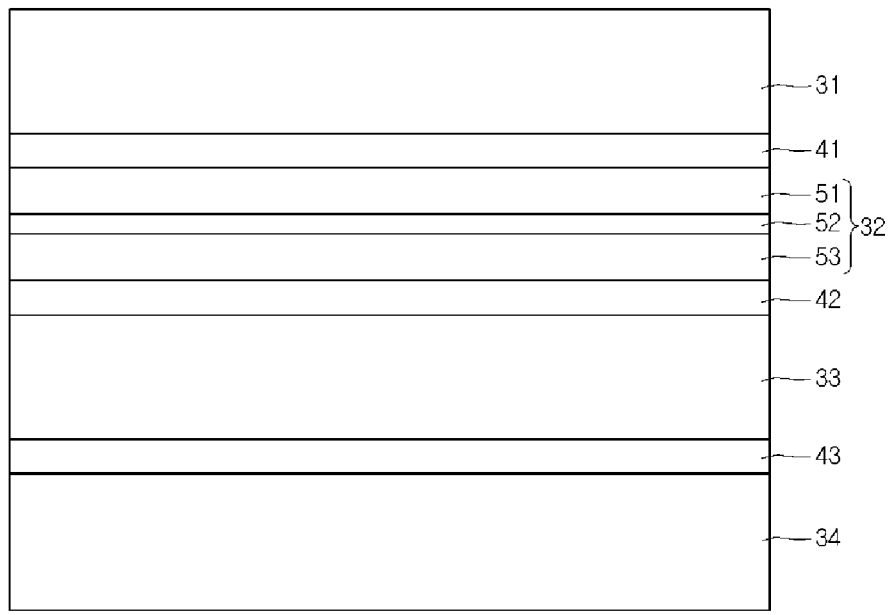
FIG. 2 is a view illustrating an active layer structure applied to a light emitting device according to an embodiment.

FIG. 2 is a view illustrating an active layer structure applied to a light emitting device according to an embodiment.

The active layer 12 according to an embodiment may include a first barrier layer 31, a second barrier layer 32, a third barrier layer 33 and a fourth barrier layer 34, as illustrated in FIG. 2. The active layer 12 may include a first well layer 41, a second well layer 42 and a third well layer 43. The first well layer may be disposed between the first barrier layer 31 and the second barrier layer 32. The second well layer 42 may be disposed between the second barrier layer 32 and the third barrier layer 33. The third well layer 43 may be disposed between the third barrier layer 33 and the fourth barrier layer 44.

For example, the first barrier layer 31 may be un-doped with dopants. The second barrier layer 32 may be doped with dopants. The second barrier layer 32 may be disposed under the first barrier layer 31 and have an area whose doping concentration changes depending on the distance from the first barrier layer 31. The third barrier layer 33 may be un-doped with dopants.

The second barrier layer 32 may include an un-doped first area 51, a doped second area 52 with dopants, and an un-doped third area 53. The doped second area 52 may be disposed under the un-doped first area 51, and the un-doped third area 53 may be disposed under the doped second area 52.

The doped second area 52 may be doped with an n-type dopants. For example, the un-doped first area 51 may be provided thicker than the doped second area 52. The un-doped third area 53 may be provided in the same thickness as the un-doped first area 51. The un-doped first area 51 may be disposed continuously to the doped second area 52 and the doped second area 52 may be disposed continuously to the un-doped third area 53.

For example, the doped second area 52 may be provided in the thickness of 18 Å to 22 Å. The un-doped first and third areas 51 and 53 may be provided in the thickness of 75 Å to 85 Å. The doped second area 52 may be doped with an n-type dopants and the doping concentration may be embodied in $1 \times 10^{16}/cm^3$ to $5 \times 10^{16}/cm^3$, for example. The dopants contained in the doped second area 52 may increase electron mobility in the active layer 12, and accordingly increase an electron-hole recombination efficiency, thereby enhancing a light extraction efficiency.

According to an embodiment, the thickness of the doped second area 52 may be 10% to 50% of the total thickness of the second barrier layer 32. When the thickness of the doped second area 52 is smaller than 10% of the thickness of the second barrier layer 32, the dopants doped in the doped second area 52 does not remarkably affect a characteristic enhancement. Further, when the thickness of the second area 52 is greater than 50% of the thickness of the second barrier layer 32, the quality of the active layer may be reduced due to the over-doped dopants in the barrier layer, and the brightness may be rather reduced due to a light absorption.

The first barrier layer 31, the second barrier layer 32, the third barrier layer 33 and the fourth barrier layer 34 each may be provided in the thickness of 170 Å to 190 Å. The first well layer 41, the second well layer 42 and the third well layer 43 each may be provided in the thickness of 65 Å to 75 Å.

The active layer 12 according to the embodiment may plurally include a pair of the first barrier layer 31 and the first well layer 41, a pair of the second barrier layer 32 and the second well layer 42, and a pair of the third barrier layer 33 and the third well layer 43. For example, the pair of the first barrier layer 31 and the first well layer 41 may be repeatedly disposed seven (7) times, subsequently the pair of the second barrier layer 32 and the second well layer 42 may be repeatedly disposed six (6) times, and subsequently the pair of the third barrier layer 33 and the third well layer 43 may be repeatedly disposed seven (7) times.

The light emitting device according to the embodiment may include the window layer 15. The window layer 15 may be disposed under the second conductive semiconductor layer 13. The window layer 15 may be embodied with a semiconductor material having a compositional formula of $(Al_xGa_{1-x})_yIn_{1-y}P(0 \leq x \leq 1,\ 0 \leq y \leq 1)$. The window layer 15 may include at least one of AlGaInP, AlInP, GaP, GaInP, etc., for example. The window layer 15 may provide a current spreading effect. The window layer 15 may include dopants. The window layer 15 may include dopants that has the same polarity as that of the second conductive semiconductor layer 13.

The light emitting device according to the embodiment may include an ODR (Omni Directional Reflector) layer 21, an ohmic contact layer 23 and a reflective layer 30.

The ODR layer 21 may perform a function to reflect light incident from the upper part to the upper part. The ODR layer 21 may be embodied to have a refractive index lower than that of the light emitting structure 10, for example. The ODR layer 21 is selected to have a low refractive index, such that there is a great gap between the refractive index of the ODR layer 21 and that of the material of the light emitting structure 10, thereby providing a reflective function. The ODR layer 21 may be disposed in contact with the window layer 15.

The ODR layer 21 may include an oxide or a nitride. The ODR layer 21 may include at least one of $SiO_2$, $SiN_2$, ITO(Indium-Tin-Oxide), IZO(Indium-Zinc-Oxide), AZO (Aluminum-Zinc-Oxide), ATO(Antimony-Tin-Oxide), IZTO(Indium-Zinc-Tin-Oxide), IAZO(Indium-Aluminum-Zinc-Oxide), GZO(Gallium-Zinc-Oxide), IGZO(Indium-Gallium-Zinc-Oxide), IGTO(Indium-Gallium-Tin-Oxide) and AZO(Aluminum-Zinc-Oxide).

The ohmic contact layer 23 may be embodied to ohmically contact with the window layer 15. The ohmic contact layer 23 may include an area that is ohmically contacted with the widow layer 15. The ohmic contact layer 23 may be electrically connected with the light emitting structure 10. The ohmic contact layer 23 may be disposed through the ODR layer 21. The ohmic contact layer 23 may be provided into the through hole which passes through the upper surface and the lower surface of the ODR layer 21. For example, the ohmic contact layer 23 may be embodied to have a circular or elliptical upper surface. The ohmic contact layer 23 may include at least any one selected from materials such as Au, Au/AuBe/Au, AuZn, ITO, AuBe, GeAu, etc., for example.

The reflective layer 30 may be disposed under the ohmic contact layer 23. The reflective layer 30 may be disposed under the ODR layer 21. The reflective layer 30 may perform a function to reflect light incident from the upper part to the upper part. The reflective layer 30 may include at least any one selected from materials such as Ag, Au, Al, etc., for example.

The light emitting device according to the embodiment may include a bonding layer 40 and a support substrate 50. The bonding layer 40 may perform a function to attach the reflective layer 30 and the support substrate 50 together.

The bonding layer 40 may include at least any one selected from materials such as Sn, AuSn, Pd, Al, Ti, Au, Ni, Cr, Ga, In, Bi, Cu, Ag, Nb, Ta, Ti/Au/In/Au, etc., for example. The support substrate 50 may include at least any one selected from materials such as Ti, Cr, Ni, Al, Pt, Au, W, Cu, Mo, Cu-W or dopants-injected semiconductor substrate (Si, Ge, GaN, GaAs, ZnO, SiC, SiGe, etc., for example).

The light emitting device according to the embodiment may include a first electrode 60 and an electrode pad 70 that are disposed on the light emitting structure 10.

The first electrode 60 may be electrically connected to the first conductive semiconductor layer 11. The first electrode 60 may be disposed in contact with the first conductive semiconductor layer 11. The first electrode 60 may be disposed in ohmic contact with the first conductive semiconductor layer 11. The first electrode 60 may include an area that is ohmic-contacted with the first conductive semiconductor layer 11. The first electrode 60 may include at least any one selected from Ge, Zn, Mg, Ca, Au, Ni, AuGe, AuGe/Ni/Au, etc. The first electrode 60 may be provided in a single layer or multiple layer structure.

A high concentration doped semiconductor layer may further be included between the first electrode 60 and the first conductive semiconductor layer 11. For example, a GaAs layer whose doping concentration is higher than that of the first conductive semiconductor layer 11 may further be disposed between the first electrode 60 and the first conductive semiconductor layer 11.

The electrode pad 70 may be electrically connected to the first electrode 60. The electrode pad 70 may be disposed on the first electrode 60. The electrode pad 70 may be disposed on the first electrode 60 in contact therewith. The electrode pad 70 may be connected to an external power supply to provide the light emitting structure 10 with power. The electrode pad 70 may include at least any one selected from Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc. The electrode pad 70 may be provided in a single layer or multiple layer.

The light emitting device according to the embodiment may include a protective layer 80. The protective layer 80 may be disposed on the light emitting structure 10. The protective layer 80 may be disposed around the light emitting structure 10. The protective layer 80 may be disposed beside the light emitting structure 10. The protective layer 80 may be disposed around the window layer 15. A portion area of the protective layer 80 may be disposed on a portion area of the window layer 15.

The protective layer 80 may be disposed on the first conductive semiconductor layer 11. The protective layer 80 may be disposed on the first electrode 60. The protective layer 80 may include a light extraction structure provided on its upper surface. The light extraction structure may be referred to as a concave-convex structure or a roughness. The light extraction structure may be arranged regularly or randomly. The light extraction structure provided on the upper surface of the protective layer 80 may be formed in a shape corresponding to that of the light extraction structure provided on the upper surface of the first conductive semiconductor layer 11.

The protective layer 80 may include at least one of an oxide and a nitride. The protective layer 80 may be formed by selecting at least one from a group of $SiO_2$, $Si_xO_y$, $Si_3N_4$, $Si_xN_y$, $SiO_xN_y$, $Al_2O_3$, $TiO_2$, AlN, etc., for example.

According to the embodiment, meanwhile, as illustrated in FIG. 1, the support substrate 50 may be embodied to have conductivity. The support substrate 50 may be connected to an external power supply, and accordingly the light emitting structure 10 may be applied with power through the support substrate 50. The second conductive semiconductor layer 13 may be applied with power through the support substrate 50.

Further, according to the embodiment, the second electrode may be electrically connected to the second conductive semiconductor layer 13. The second electrode may include at least one of the ohmic contact layer 23, the reflective layer 30, the bonding layer 40 and the support substrate 50.

In the light emitting device according to the embodiment, a barrier layer doped with dopants may be disposed in the center of the active layer 12, thereby increasing electron mobility in the active layer 12. In the light emitting device according to the embodiment, a barrier layer doped with dopants may be included in the active layer 12. Accordingly, in the light emitting device according to the embodiment, an electron-hole recombination efficiency increases so that an internal light emission efficiency may be increased. Also, the light emitting device according to the embodiment may improve an operating voltage, and enhance the entire light extraction efficiency.

Then, a method for manufacturing a light emitting device according to an embodiment will be described with reference to FIGS. 3 to 6.

Figure 3:
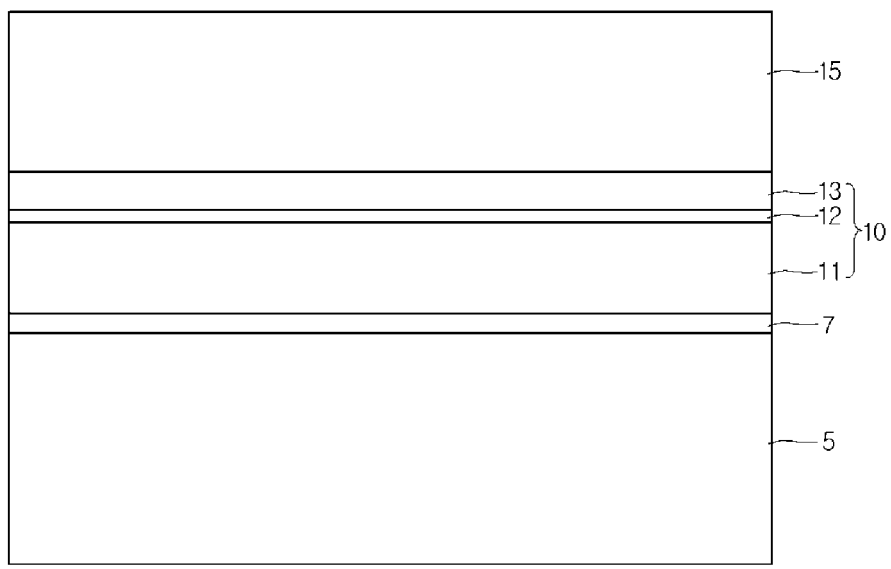
FIGS. 3 to 6 are views illustrating a method for manufacturing a light emitting device according to an embodiment.

In accordance with the method for manufacturing a light emitting device according to an embodiment, as illustrated in FIG. 3, a substrate 5 may have an etching stop layer 7, a first conductive semiconductor layer 11, an active layer 12, a second conductive semiconductor layer 13 and a window layer 15, which are formed thereon. The first conductive semiconductor layer 11, the active layer 12 and the second conductive semiconductor layer 13 may be defined as a light emitting structure 10.

The substrate 5 may be formed of at least one of a sapphire substrate ($Al_2O_3$), SiC, GaAs, GaN, ZnO, Si, GaP, InP and Ge, which is not limited thereto. A buffer layer may further be formed between the substrate 5 and the etching stop layer 7.

The etching stop layer 7 may be embodied with a semiconductor material having a compositional formula of $(Al_xGa_{1-x})_yIn_{1-y}P(0 \leq x \leq 1, 0 \leq y \leq 1)$, for example. A function of the etching stop layer 7 will be described again below.

According to the embodiment, the first conductive semiconductor layer 11 may be formed of an n-type semiconductor layer doped with an n-type dopant as a first conductive dopant, and a second conductive semiconductor layer 13 may be formed of a p-type semiconductor layer doped with a p-type dopant as a second conductive dopant. Also, the first conductive semiconductor layer 11 may be formed of a p-type semiconductor layer, and the second conductive semiconductor layer 13 may be formed of an n-type semiconductor layer.

The first conductive semiconductor layer 11 may include an n-type semiconductor layer, for example. The first conductive semiconductor layer 11 may be embodied with a compound semiconductor. The first conductive semiconductor layer 11 may be embodied with a groups II-VI compound semiconductor or a groups III-V compound semiconductor.

For example, the first conductive semiconductor layer 11 may be embodied with a semiconductor material having a compositional formula of $(Al_xGa_{1-x})_yIn_{1-y}P(0 \leq x \leq 1, 0 \leq y \leq 1)$. In the first conductive semiconductor layer 11, the compositional formula may have y of a value 0.5 and x of values 0.5 to 0.8. The first conductive semiconductor layer 11 may be selected from AlGaInP, AlInP, GaP, GaInP, etc., and may be doped with Si, Ge, Sn, Se, Te, etc., for example.

The active layer 12 is a layer in which electrons (or holes) injected through the first conductive semiconductor layer 11 and holes (or electrons) injected through the second conductive semiconductor layer 13 meet each other and which emits light using a band gap difference of energy bands according to materials forming the active layer 12. The active layer 12 may be formed of any one of a single well structure, a multiple well structure, a quantum dot structure and a quantum wire structure, which is not limited thereto.

The active layer 12 may be embodied with a compound semiconductor. The active layer 12 may be embodied with a groups II-VI or groups III-V compound semiconductor, for example. The active layer 12 may be embodied with a semiconductor material having a compositional formula of $(Al_xGa_{1-x})_yIn_{1-y}P(0 \leq x \leq 1, 0 \leq y \leq 1)$, for example. The active layer 12 may be selected from AlGaInP, AlInP, GaP, GaInP, etc., for example. When the active layer 12 is embodied with a multiple well structure, the active layer 12 may be embodied by laminating a plurality of well layers and a plurality of barrier layers.

The second conductive semiconductor layer 13 may be embodied with a p-type semiconductor layer, for example. The second conductive semiconductor layer 13 may be embodied with a compound semiconductor. The second conductive semiconductor layer 13 may be embodied with a groups II-VI or groups III-V compound semiconductor, for example.

For example, the second conductive semiconductor layer 13 may be embodied with a semiconductor material having a compositional formula of $(Al_xGa_{1-x})_yIn_{1-y}P$ $(0 \leq x \leq 1, 0 \leq y \leq 1)$. The second conductive semiconductor layer 13 may be selected from AlGaInP, AlInP, GaP, GaInP, etc., and doped with a p-type dopant such as Mg, Zn, Ca, Sr, Ba, C, etc., for example.

For example, the light emitting structure 10 may be embodied by including two or more devices selected from Aluminum (Al), Gallium (Ga), Indium (In), and Phosphorus (P).

The active layer 12 according to the embodiment may include a plurality of barrier layers and a plurality of well layers. The active layer 12 may include a barrier layer having an area un-doped with dopants and an area doped with dopants. The barrier layer of the active layer 12 may be doped with n-type dopants. For example, the barrier layer and well layer of the active layer 12 may be provided by a composite of AlGaInP, and the content of Al contained in the barrier layer is greater than the content of Al contained in the well layer.

The window layer 15 may be embodied with a semiconductor material having a compositional formula of $(Al_xGa_{1-x})_yIn_{1-y}P$ ($0 \le x \le 1$, $0 \le y \le 1$). The window layer 15 may be selected from AlGaInP, AlInP, GaP, GaInP, etc., for example. The window layer 15 may provide a current spreading effect when the light emitting device is driven.

Figure 4:
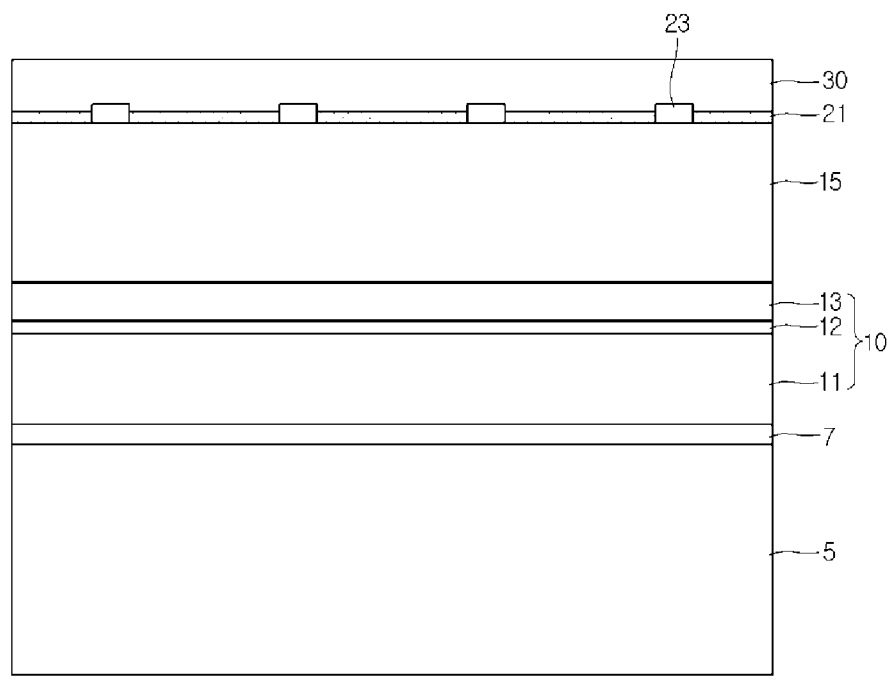

Next, as illustrated in FIG. 4, the window layer 15 may have an ODR layer 21, an ohmic contact layer 23 and a reflective layer 30, which are formed thereon.

The ODR layer 21 may perform a function to reflect an incident light again. The ODR layer 21 may be embodied to have a refractive index lower than that of the light emitting structure 10, for example.

The ODR layer 21 is selected to have a low refractive index, such that there is a great gap between the refractive index of the ODR layer 21 and that of the material of the light emitting structure 10, thereby providing a reflective function. The ODR layer 21 may be disposed in contact with the window layer 15.

The ODR layer 21 may include an oxide or a nitride. The ODR layer 21 may include at least any one selected from $SiO_2$, $SiN_2$, ITO(Indium-Tin-Oxide), IZO(Indium-Zinc-Oxide), AZO(Aluminum-Zinc-Oxide), ATO(Antimony-Tin-Oxide), IZTO(Indium-Zinc-Tin-Oxide), IAZO(Indium-Aluminum-Zinc-Oxide), GZO(Gallium-Zinc-Oxide), IGZO(Indium-Gallium-Zinc-Oxide), IGTO(Indium-Gallium-Tin-Oxide) and AZO(Aluminum-Zinc-Oxide), for example.

The ohmic contact layer 23 may be embodied to ohmically contact with the window layer 15. The ohmic contact layer 23 may include an area that is ohmically contacted with the widow layer 15. The ohmic contact layer 23 may be electrically connected to the light emitting structure 10.

The ohmic contact layer 23 may be disposed through the ODR layer 21. For example, the ohmic contact layer 23 may be embodied to have a circular or elliptical upper surface. The ohmic contact layer 23 may include at least any one selected from materials such as Au, Au/AuBe/Au, AuZn, ITO, AuBe, GeAu, etc., for example.

The reflective layer 30 may be disposed on the ohmic contact layer 23. The reflective layer 30 may be disposed on the ODR layer 21. The reflective layer 30 may function to reflect an incident light again. The reflective layer 30 may include at least any one selected from materials such as Ag, Au, Al, etc., for example.

Figure 5:
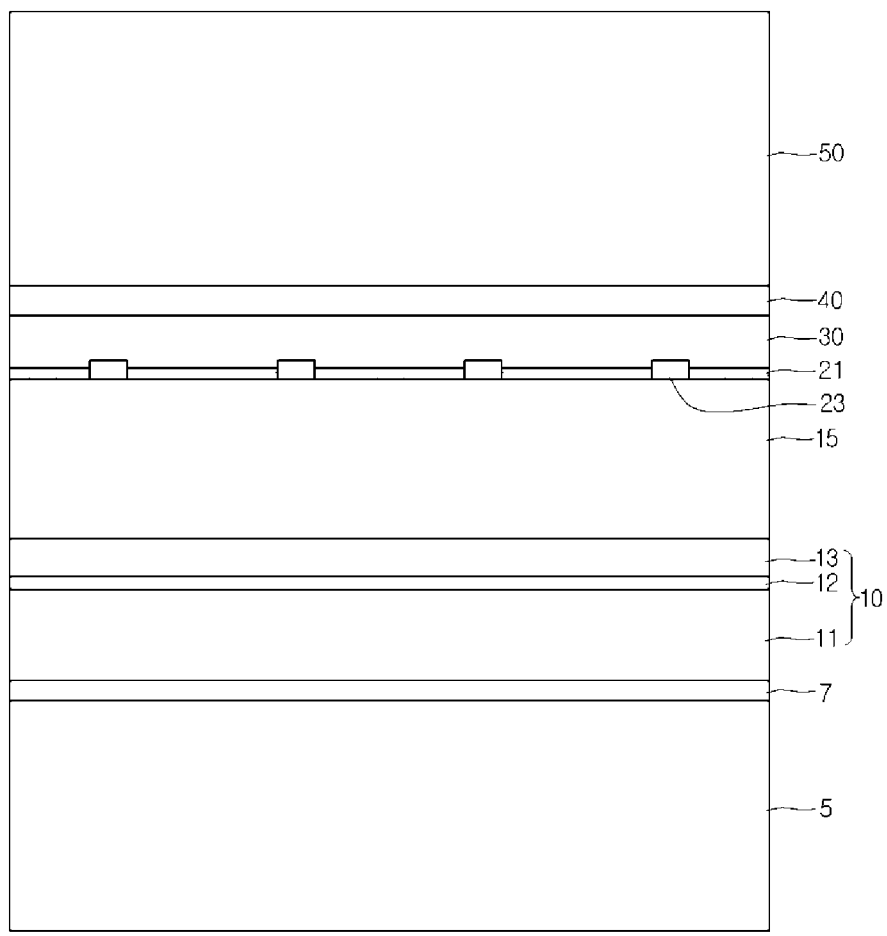

Subsequently, as illustrated in FIG. 5, the reflective layer 30 may have a bonding layer 40 and a support layer 50 provided thereon.

The bonding layer 40 may function to attach the reflective layer 30 and the support substrate 50 together. The bonding layer 40 may include at least any one selected from materials such as Sn, AuSn, Pd, Al, Ti, Au, Ni, Cr, Ga, In, Bi, Cu, Ag, Nb, Ta, Ti/Au/In/Au, etc., for example. The support substrate 50 may include at least any one selected from materials such as Ti, Cr, Ni, Al, Pt, Au, W, Cu, Mo, Cu-W or dopants-injected semiconductor substrate (Si, Ge, GaN, GaAs, ZnO, SiC, SiGe, etc., for example).

Next, the substrate 5 is removed using the etching stop layer 7. As an example, the substrate 5 may be removed by an etching process. When the substrate 5 is embodied with GaAs, the substrate 5 may be removed by a wet etching process, where the etching stop layer 7 is not etched and only the substrate 5 is etched and separated so that the etching stop layer 7 may function as a stop layer. The etching stop layer 7 may be separated from the light emitting structure 10 through a separate removing process. For example, the etching stop layer 7 may be removed through a separate etching process.

Figure 6:
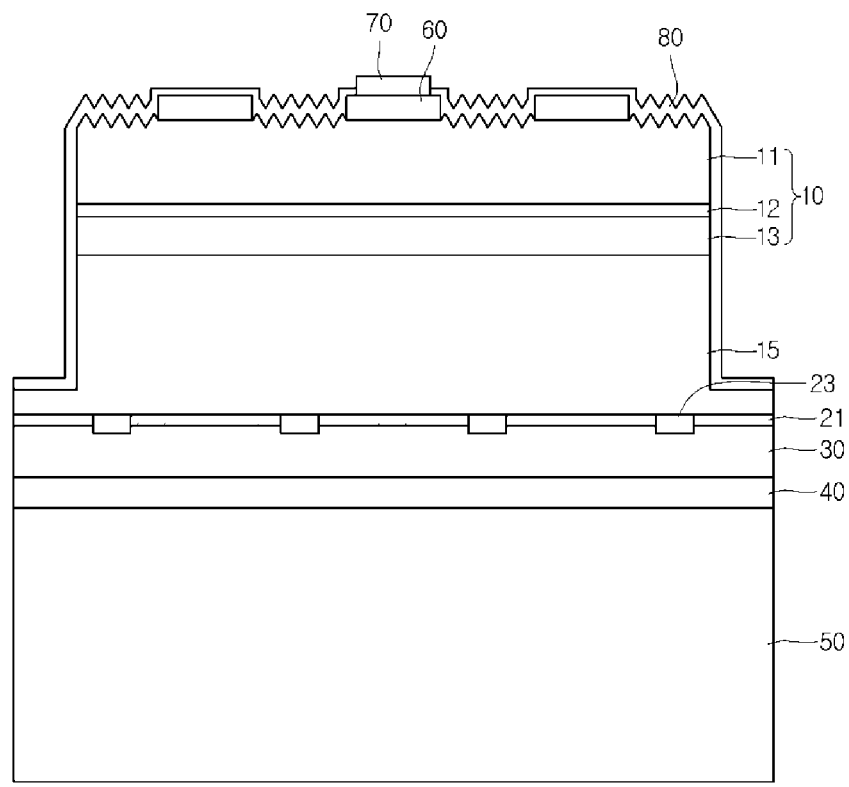

Subsequently, as illustrated in FIG. 6, a first electrode 60 may be formed on the light emitting structure 10 and an isolation etching is performed, so that a side of the light emitting structure 10 may be etched.

The first electrode 60 may be electrically connected to the first conductive semiconductor layer 11. The first electrode 60 may be disposed in contact with the first conductive semiconductor layer 11. The first electrode 60 may be disposed in ohmic contact with the first conductive semiconductor layer 11. The first electrode 60 may include an area that is ohmically contacted with the light emitting structure 10. The first electrode 60 may include an area that is ohmically contacted with the first conductive semiconductor layer 11. The first electrode 60 may include at least any one selected from Ge, Zn, Mg, Ca, Au, Ni, AuGe, AuGe/Ni/Au, etc.

Further, as illustrated in FIG. 6, a protective layer 80 and an electrode pad 70 may be formed on the light emitting structure 10 and the first electrode 60.

The protective layer 80 may be disposed on the light emitting structure 10. The protective layer 80 may be disposed around the light emitting structure 10. The protective layer 80 may be disposed beside the light emitting structure 10. The protective layer 80 may be disposed around the window layer 15. A portion area of the protective layer 80 may be disposed on a portion area of the window layer 15.

The protective layer 80 may include at least one of an oxide and a nitride. The protective layer 80 may be formed by selecting at least one from a group of $SiO_2$, $Si_xO_y$, $Si_3N_4$, $Si_xN_y$, $SiO_xN_y$, $Al_2O_3$, $TiO_2$, AlN, etc., for example.

The protective layer 80 may be disposed on the first conductive semiconductor layer 11. The protective layer 80 may be disposed on the first electrode 60. The protective layer 80 may include a light extraction structure provided on its upper surface. The light extraction structure may be referred to as a concave-convex structure or a roughness. The light extraction structure may be arranged regularly or randomly.

The electrode pad 70 may be electrically connected to the first electrode 60. The electrode pad 70 may be disposed on the first electrode 60. The electrode pad 70 may be disposed on the first electrode 60 in contact therewith. The electrode pad 70 may be connected to an external power supply to provide the light emitting structure 10 with power. The electrode pad 70 may include at least any one selected from Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc.

The above described method for manufacturing a light emitting device may be modified and embodied according to the need or a process design.

In the light emitting device according to the embodiment, the active layer 12 may have a barrier layer doped with dopants, which may be disposed in the center of the active layer 12, thereby increasing electron mobility in the active layer 12. In the light emitting device according to the embodiment, accordingly, an electron-hole recombination efficiency increases, so that an internal light emission efficiency may be increased. Further, the light emitting device according to the embodiment may improve an operating voltage, and enhance the entire light extraction efficiency.

Figure 7:
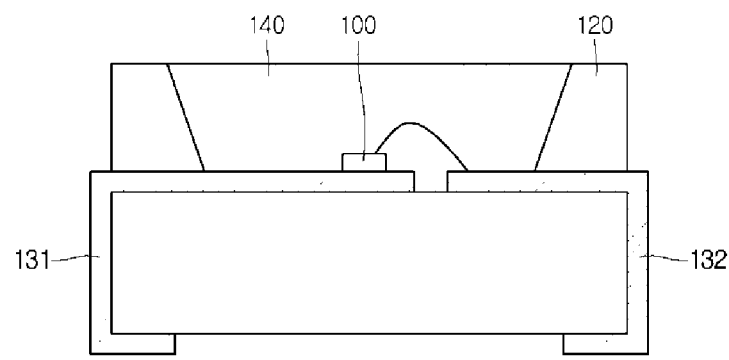
FIG. 7 is a view illustrating a light emitting device package according to an embodiment.

FIG. 7 is a view illustrating a light emitting device package according to an embodiment.

Referring to FIG. 7, a light emitting device package according to an embodiment may include a body 120, a first lead electrode 131 and a second lead electrode 132 that are disposed in the body 120, a light emitting device 100 according to the embodiment that is provided in the body 120 and is electrically connected to the first and second lead electrodes 131 and 132, and a molding member 140 surrounding the light emitting device 100.

The body 120 may be formed including a silicon material, a synthetic resin material or a metallic material, and an incline may be formed around the light emitting device 100.

The first and second lead electrodes 131 and 132 may be electrically separated from each other, which provide the light emitting device 100 with power. Also, the first and second lead electrodes 131 and 132 may reflect light generating in the light emitting device 100 to increase a light efficiency, and discharge the heat generating in the light emitting device 100 to the outside.

The light emitting device 100 may be disposed on the body 120, the first lead electrode 131 or the second lead electrode 132.

The light emitting device 100 may be electrically connected to the first and second lead electrodes 131 and 132 in any one of a wiring method, a flip chip method or a die bonding method.

The molding member 140 may surround the light emitting device 100 to protect it. Also, the molding member 140 may include a fluorescent substrate to change the wavelength of a light emitting from the light emitting device 100.

The light emitting device or the light emitting device package according to the embodiment may be plurally arrayed on the substrate, and optical members such as a lens, a light guide panel, a prism sheet, a diffusion sheet are disposed in a light path of the light emitting device package. The light emitting device package, the substrate and the optical member may function as a light unit. The light unit may be embodied in a top view or side view type to be provided to a display device of a mobile terminal and a lap top computer or variously applied to a light device and an indicating device. Another embodiment may be embodied with a light unit including the light emitting device or the light emitting device package described in the above-described embodiment. For example, the light device may include a lamp, a street lamp, an electronic signage, a headlight, etc.

The light emitting device according to the embodiment may be applied to a light unit. The light unit may include a structure of a plurality of arrayed light emitting devices, a display device illustrated in FIGS. 8 and 9, and a light device illustrated in FIG. 10.

Figure 8:
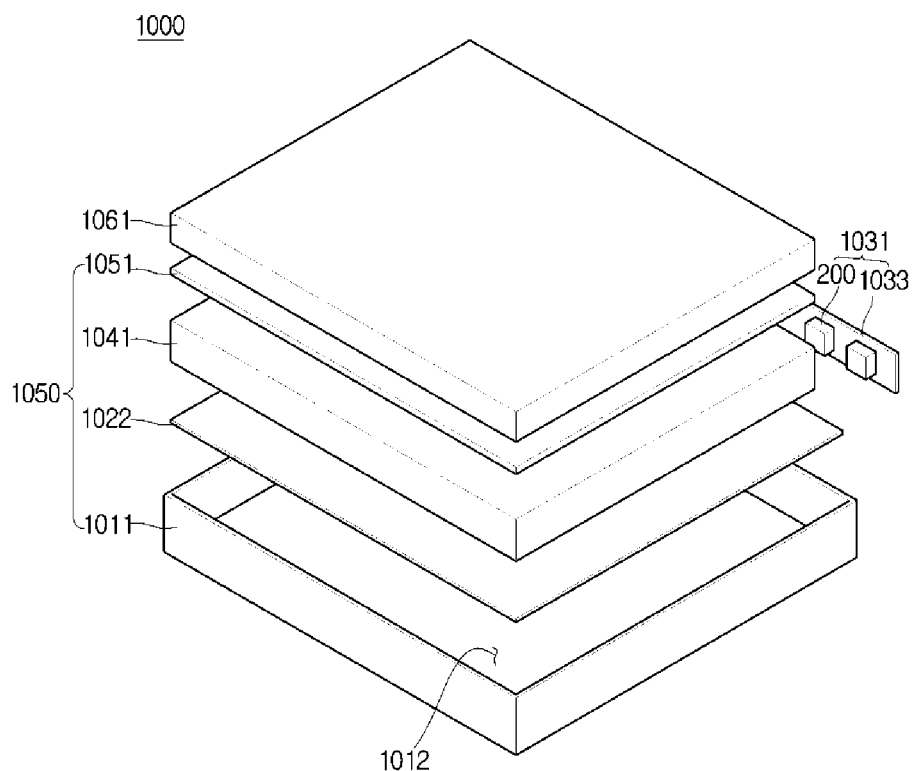
FIG. 8 is a view illustrating a display device according to an embodiment.

Referring to FIG. 8, the display device 1000 according to an embodiment may include a light guide panel 1041, a light emitting module 1031 providing the light guide panel 1041 with light, a reflective member 1022 disposed under the light guide panel 1041, an optical sheet 1051 disposed on the light guide panel 1041, a display panel 1061 disposed on the optical sheet 1051, a display panel 1061 disposed on the optical sheet 1051, and a bottom cover 1011 receiving the light guide panel 1041, the light emitting module 1031 and the reflective member 1022, which is not limited thereto.

The bottom cover 1011, the reflective sheet 1022, the light guide panel 1041 and the optical sheet 1051 may be defined as a light unit 1050.

The light guide panel 1041 diffuses light to make it a surface light source. The light guide panel 1041 is made of a transparent material including any one of an acrylic resin series such as PMMA (polymethyl methaacrylate), PET (polyethylene terephthalate), PC (poly carbonate), COC (cycloolefin copolymer) and PEN (polyethylene naphthalate) resins.

The light emitting module 1031 provides at least one side of the light guide panel 1041 with light, and ultimately functions as a light source of the display device.

At least one light emitting module 1031 may be provided, and light may be directly or indirectly provided from one side of the light guide panel 1041. The light emitting module 1031 may include the substrate 1033 and the light emitting device or the light emitting device package 200 according to the above-described embodiment. The light emitting device package 200 may be arrayed on the substrate 1033 in a predetermined interval.

The substrate 1033 may be a printed circuit board (PCB) including a circuit pattern. However, the board 1033 may include a metal core PCB (MCPCB) and a flexible PCB (FPCB) as well as a general PCB, which is not limited thereto. When the light emitting device package 200 is provided on the side of the bottom cover 1011 or on a heat radiating plate, the substrate 1033 may be removed. Here, a portion of the heat radiating plate may be contacted with the top of the bottom cover 1011.

Further, in a plurality of light emitting device packages 200, an exit surface emitting light is mounted apart from the light guide panel 1041 in a predetermined distance, which is not limited thereto. The light emitting device package 200 may directly or indirectly provide light to a light-incident surface which is one side of the light guide panel 1041, which is not limited thereto.

The reflective member 1022 may be disposed under the light guide panel 1041. The reflective member 1022 may reflect the light incident to the lower surface of the light guide panel 1041 to direct it upward, thereby enhancing the brightness of the light unit 1050. The reflective member 1022 may be formed of PET, PC, PVC resin, etc., for example, which is not limited thereto. The reflective member 1022 may be the top of the bottom cover 1011, which is not limited thereto.

The bottom cover 1011 may receive the light guide panel 1041, the light emitting module 1031 and the reflective member 1022. For this, the bottom cover 1011 may include a receiving portion 1012 that has a box shape whose top is opened, which is not limited thereto. The bottom cover 1011 may be combined with the top cover, which is not limited thereto.

The bottom cover 1011 may be formed of a metallic material or a resin material, and manufactured using a process such as a press forming or an extrusion molding. Also, the bottom cover 1011 may include a metallic material which has a good thermal conductivity and a non-metallic material, which is not limited thereto.

The display panel 1061 may be an LCD panel, for example, which includes a first and a second substrate that have transparent material opposing each other, and a liquid crystal layer interposed between the first and second substrates. The display panel 1061 may have a polarizing plate attached to at least one side of it, which is not limited to such an attachment structure of the polarizing plate. The display panel 1061 displays information by the light that has passed through the optical sheet 1051. The display device 1000 may be applied to all kinds of mobile terminal, a monitor of lap top computer, a television set, etc.

The optical sheet 1051 may be disposed between the display panel 1061 and the light guide panel 1041, including at least one transparent sheet. The optical sheet 1051 may include at least one of a diffusion sheet, a horizontal and vertical prism sheet and a brightness enhancing sheet, for example. The diffusion sheet diffuses an incident light, the horizontal and vertical prism sheet collects the incident light to a display area, and the brightness enhancing sheet reuses lost light to improve brightness. Also, a protective sheet may be disposed on the display panel 1061, which is not limited thereto.

Here, optical members such as the light guide panel 1041 and the optical sheet 1051 may be disposed in an optical path of the light emitting module 1031, which is not limited thereto.

Figure 9:
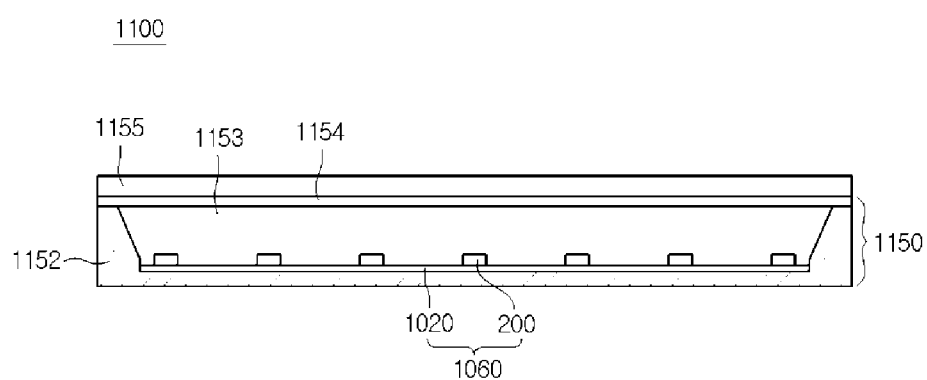
FIG. 9 is a view illustrating another example of the display device according to an embodiment.

FIG. 9 is a view illustrating another example of the display device according to an embodiment.

Referring to FIG. 9, a display device 1100 may include a bottom cover 1152, a substrate 1020 on which the above-disclosed light emitting devices 100 are arrayed, an optical member 1154, and a display panel 1155. The substrate 1020 and the light emitting device package 200 may be defined as a light emitting module 1060. The bottom cover 1152 may include a receiving portion 1153, which is not limited thereto.

Here, the optical member 1154 may include at least one of a lens, a light guide panel, a diffusion sheet, a horizontal and vertical prism sheet, and a brightness enhancing sheet. The light guide panel may be formed of a PC material or a PMMA (Poly methyl methacrylate) material, and such a light guide panel may be removed. The diffusion sheet diffuses an incident light, and horizontal and vertical prism sheet collects the incident light to the display area. The brightness enhancing sheet reuses lost light to improve brightness.

The optical member 1154 may be disposed on the light emitting module 1060 to produce planar light using the light emitting from the light emitting module 1060 or diffuse and collect the light emitting from the light emitting module 1060.

Figure 10:
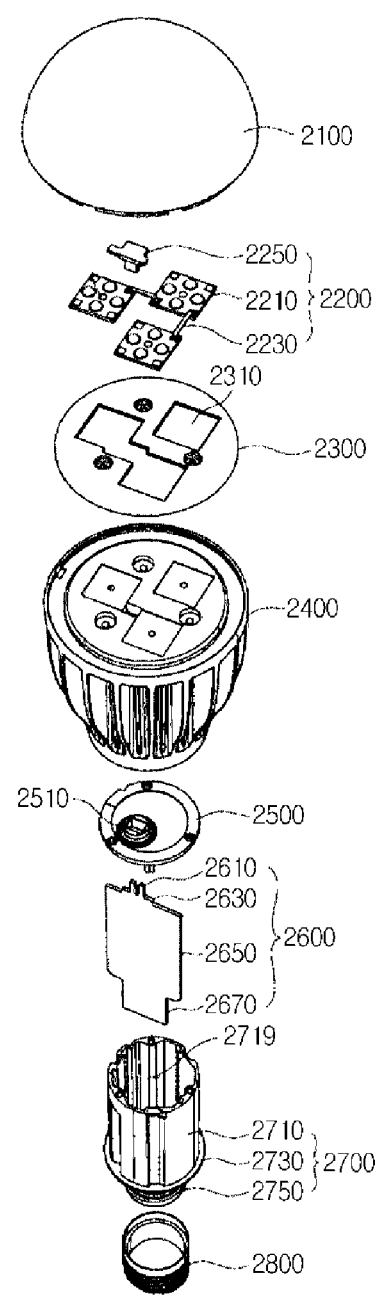
FIG. 10 is a view illustrating a light device according to an embodiment.

FIG. 10 is a view illustrating a light device according to an embodiment.

Referring to FIG. 10, a light device according to an embodiment may include a cover 2100, a light source module 2200, a radiator 2400, a power providing portion 2600, an inner case 2700 and a socket 2800. Also, the light device according to the embodiment may further include at least one of a member 2300 and a holder 2500. The light source module 2200 may include a light emitting device package according to the embodiment.

For example, the cover 2100 may have a bulb or hemisphere shape, which may be provided in a hollow and partially-opened shape. The cover 2100 may be optically coupled with the light source module 2200. For example, the cover 2100 may diffuse, scatter or excite the light provided from the light source module 2200. The cover 2100 may be a kind of optical member. The cover 2100 may be coupled with the radiator 2400. The cover 2100 may have a coupling portion which is coupled with the radiator 2400.

The cover 2100 has an inner surface coated with a milk-white paint. The milk-white paint may include a diffusion material to diffuse light. The cover 2100 has the inner surface whose surface roughness is greater than that of the outer surface thereof. That is for the purpose of sufficiently scattering and diffusing the light from the light source module 2200 to discharge the light to the outside.

A material of the cover 2100 may include glass, plastic, polypropylene (PP), polyethylene (PE), and polycarbonate (PC). Here, the polycarbonate has the superior light resistance, heat resistance and strength among the above materials. The cover 2100 may be transparent so that the light source module 220 may be viewed from the outside, or opaque. The cover 2100 may be formed through a blow molding scheme.

The light source module 2200 may be disposed on one side of the radiator 2400. Accordingly, the heat from the light source module 2200 is transferred to the radiator 2400. The light source module 2200 may include a light source unit 2210, a connection plate 2230, and a connector 2250.

The member 2300 is disposed on a top surface of the radiator 2400, and includes guide grooves 2310 into which a plurality of light source units 2210 and the connector 2250 are inserted. The guide grooves 2310 correspond to a substrate of the light source unit 2210 and the connector 2250.

A surface of the member 2300 may be covered or coated with a light reflective material. For example, the surface of the member 2300 may be covered or coated with white paint. The member 2300 again reflects the light which is reflected by the inner surface of the cover 2100 to be returned to the direction of the light source module 2200, to the direction of the cover 2100. Accordingly, the light efficiency of the light device according to the embodiment may be improved.

The member 2300 may be formed of an insulating material, for example. The connection plate 2230 of the light source module 2200 may include an electrically conductive material. Accordingly, the radiator 2400 may be electrically connected to the connection plate 2230. The member 2300 may be configured of an insulating material, thereby preventing the connection plate 2230 from being electrically shorted with the radiator 2400. The radiator 2400 receives heat from the light source module 2200 and the power providing portion 2600 and radiates the heat.

The holder 2500 covers a receiving groove 2719 of an insulating portion 2710 of an inner case 2700. Accordingly, the power providing portion 2600 received in the insulating portion 2710 of the inner case 2700 is closed. The holder 2500 has a guide protrusion 2510. The guide protrusion 2510 has a hole through which the protrusion 2610 of the power providing portion 2600 passes.

The power providing portion 2600 processes or converts an electrical signal provided from the outside and provides the light source module 2200 with the processed or converted electrical signal. The power providing portion 2600 is received in the receiving groove 2719 of the inner case 2700, and is closed inside the inner case 2700 by the holder 2500.

The power providing portion 2600 may include a protrusion 2610, a guide portion 2630, a base 2650, and an extension portion 2670.

The guide portion 2630 has a shape protruding from one side of the base 2650 to the outside. The guide portion 2630 may be inserted into the holder 2500. A plurality of components may be disposed on one side of the base 2650. The plurality of components may include a DC converter converting AC power provided from an external power supply into a DC power, a driving chip controlling a driving of the light source module 2200, and an electrostatic discharge (ESD) protection device protecting the light source module 2200, which is not limited thereto.

The extension portion 2670 has a shape protruding from an opposite side of the base 2650 to the outside. The extension portion 2670 is inserted into an inside of the connection portion 2750 of the inner case 2700, and receives an electrical signal from the outside.

For example, the width of the extension portion 2670 may be smaller than or equal to that of the connection portion 2750 of the inner case 2700. Each one terminal of "+electric wire" and "−electric wire" may be electrically connected to the extension portion 2670, and each opposite terminal of "+electric wire" and "−electric wire" may be electrically connected to a socket 2800.

The inner case 2700 may include a molding portion therein together with the power providing portion 2600. The molding portion is prepared by hardening molding liquid, which fixes the power providing portion 2600 inside the inner case 2700.

The aforementioned characteristic, structure, effect, and the like are included in at least one embodiment of the present disclosure, and are not essentially limited to only one embodiment. Further, the characteristic, structure, effect, and the like described in each embodiment may be carried out in other embodiments through combination or modification by those skilled in the art to which the exemplary embodiments pertain. Accordingly, it shall be construed that contents relating to the combination and the modification are included in the scope of the present disclosure.

Further, although embodiments of the present disclosure were described above, these are just examples and do not limit the present disclosure. The present disclosure may be changed and modified in various ways, without departing from the essential features of the present disclosure, by those skilled in the art. For example, the components described in detail in the embodiments of the present disclosure may be modified. Further, differences due to the modification and application should be construed as being included in the scope and spirit of the present disclosure, which is described in the accompanying claims.

INDUSTRIAL APPLICATION

The light emitting device, the light emitting device package and the light unit according to the embodiment may have advantages of reducing an operating voltage and enhancing luminous intensity.

The invention claimed is:

1. A light emitting device, comprising:
a first conductive semiconductor layer;
a second conductive semiconductor layer; and
an active layer comprising a plurality of barrier layers and a plurality of well layers, the active layer being disposed between the first conductive semiconductor layer and the second conductive semiconductor layer,
the plurality of barrier layers including a first barrier layer, a second barrier layer, and a third barrier layer, the second barrier layer being disposed between the first barrier layer and the third barrier layer,
the plurality of well layers including a first well layer and a second well layer, the first well layer being disposed between the first barrier layer and the second barrier layer, the second well layer being disposed between the second barrier layer and the third barrier layer,
wherein the first barrier layer and the third barrier layer are un-doped layers,
wherein the second barrier layer includes an un-doped first area, a doped second area disposed under the first area, and an un-doped third area disposed under the second area, and
wherein a thickness of the second area is less than a thickness of the first area and is less than a thickness of the third area.

2. The light emitting device of claim 1, wherein the doped second area in the second barrier layer comprises one or more n-type dopants.

3. The light emitting device of claim 1, wherein the plurality of barrier layers and the plurality of well-layers comprise aluminum gallium indium phosphide (AlGaInP).

4. The light emitting device of claim 3, wherein the content of aluminum (Al) contained in the plurality of barrier layers is greater than the content of Al contained in the plurality of well layers.

5. The light emitting device of claim 1, wherein the thickness of the un-doped first area is equal to the thickness of the un-doped third area.

6. The light emitting device of claim 1, wherein the un-doped first area is disposed continuously over the doped second area, and the doped second area is disposed continuously over the un-doped third area.

7. The light emitting device of claim 1, wherein the thickness of the doped second area is 10% to 50% of a thickness of the second barrier layer.

8. The light emitting device of claim 7, wherein the thickness the un-doped first area is in a range of 75Å to 85Å,
wherein the thickness of the doped second area is in a range of 18Å to 22Å, and
wherein the thickness of the un-doped third area is in a range of 75Å to 85Å.

9. The light emitting device of claim 7, wherein the thickness of the second barrier layer is in a range of 170Å to 190Å.

10. The light emitting device of claim 1, wherein a doping concentration of the doped second area is in a range of $1 \times 10^{16}/cm^3$ to $5 \times 10^{16}/cm^3$.

11. A light emitting device, comprising:
a first conductive semiconductor layer;
an active layer comprising an un-doped first barrier layer disposed under the first conductive semiconductor layer, a second barrier layer which is disposed under the un-doped first barrier layer and has an area whose doping concentration changes depending on the distance from the un-doped first barrier layer, an un-doped third barrier layer disposed under the second barrier layer, a first well layer disposed between the un-doped first barrier and the second barrier layer, and a second well layer disposed between the second barrier layer and the un-doped third barrier layer;
a second conductive semiconductor layer under the active layer; and
a window layer under the second conductive semiconductor layer,
wherein the second barrier layer comprises an un-doped first area, a doped second area under the first area, and an un-doped third area under the second area, and
wherein the doped second area has a thickness thinner than a thickness of each of the un-doped first area and the un-doped third area.

12. The light emitting device of claim 11, wherein the second barrier layer comprises one or more n-type dopants.

13. The light emitting device of claim 11, wherein the first, second, and third barrier layers and the first and second well layers comprise aluminum gallium indium phosphide (AlGaInP).

14. The light emitting device of claim 13, wherein the content of aluminum (Al) contained in the first, second, and third barrier layers is greater than the content of Al contained in the first and second well layers.

15. The light emitting device of claim 11, wherein the un-doped first area is disposed continuously over the doped second area, and the doped second area is disposed continuously over the un-doped third area.

16. The light emitting device of claim 11, wherein the thickness of the doped second area is 10% to 50% of a thickness of the second barrier layer.

17. The light emitting device of claim 16, wherein the thickness of the un-doped first area is in a range of 75Å to 85Å,
wherein the thickness of the doped second area is in a range of 18Å to 22Å, and
wherein the thickness of the un-doped third area is in a range of 75Å to 85Å.

18. The light emitting device of claim 16, wherein each of the first barrier layer, the second barrier layer, and the third barrier layer has a respective thickness in a range of 170Å to 190Å.

19. The light emitting device of claim 11, wherein the doping concentration of the doped second area is in a range of $1\times10^{16}/cm^3$ to $5\times10^{16}/cm^3$.

* * * * *